United States Patent
Lee et al.

(10) Patent No.: US 7,807,512 B2
(45) Date of Patent: Oct. 5, 2010

(54) SEMICONDUCTOR PACKAGES AND METHODS OF FABRICATING THE SAME

(75) Inventors: Teak-Hoon Lee, Hwaseong-si (KR); Pyoung-Wan Kim, Suwon-si (KR); Nam-Seog Kim, Yongin-si (KR); Chul-Yong Jang, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 70 days.

(21) Appl. No.: 12/320,916

(22) Filed: Feb. 9, 2009

(65) Prior Publication Data

US 2009/0239336 A1 Sep. 24, 2009

(30) Foreign Application Priority Data

Mar. 21, 2008 (KR) .................... 10-2008-0026413

(51) Int. Cl.
*H01L 21/00* (2006.01)
*H01L 21/30* (2006.01)
*H01L 21/46* (2006.01)

(52) U.S. Cl. .............. 438/127; 438/108; 438/107; 438/456

(58) Field of Classification Search ......... 438/106–127, 438/455–459
See application file for complete search history.

(56) References Cited

U.S. PATENT DOCUMENTS 6,777,266 B2 * 8/2004 Huang et al. ............. 438/112

| 6,836,025 | B2 | 12/2004 | Fujisawa et al. |
| 7,053,486 | B2 | 5/2006 | Shizuno |
| 7,321,164 | B2 * | 1/2008 | Hsu .................... 257/686 |
| 2004/0106229 | A1 * | 6/2004 | Jiang et al. .......... 438/106 |
| 2006/0091514 | A1 | 5/2006 | Yang et al. |

FOREIGN PATENT DOCUMENTS

| JP | 2001-250836 | 9/2001 |
| JP | 2004-056093 | 2/2004 |
| JP | 2004-165190 | 6/2004 |
| JP | 2005-191336 | 7/2005 |
| KR | 10-2003-0094029 | 12/2003 |
| KR | 10-2005-0053476 | 6/2005 |
| KR | 10-0639556 | 10/2006 |

* cited by examiner

*Primary Examiner*—Ha Tran T Nguyen
*Assistant Examiner*—Karen M Kusumakar
(74) *Attorney, Agent, or Firm*—Harness, Dickey & Pierce, P.L.C.

(57) ABSTRACT

A semiconductor package and module, and methods of fabricating the same are provided. A method of fabricating a semiconductor package may include bonding rear surfaces of first and second semiconductor chips to each other, each of the semiconductor chips having chip pads exposed on front surfaces. The method may also include forming an encapsulation portion configured to encapsulate side surfaces of the bonded semiconductor chips, forming via plugs configured to pass through the encapsulation portion, forming an insulating layer configured to expose surfaces of the chip pads and the via plugs on the exposed surfaces of the two semiconductor chips and surfaces of the encapsulation portion, and forming package pads on the exposed surfaces of the chip pads and the surfaces of the via plugs.

20 Claims, 11 Drawing Sheets

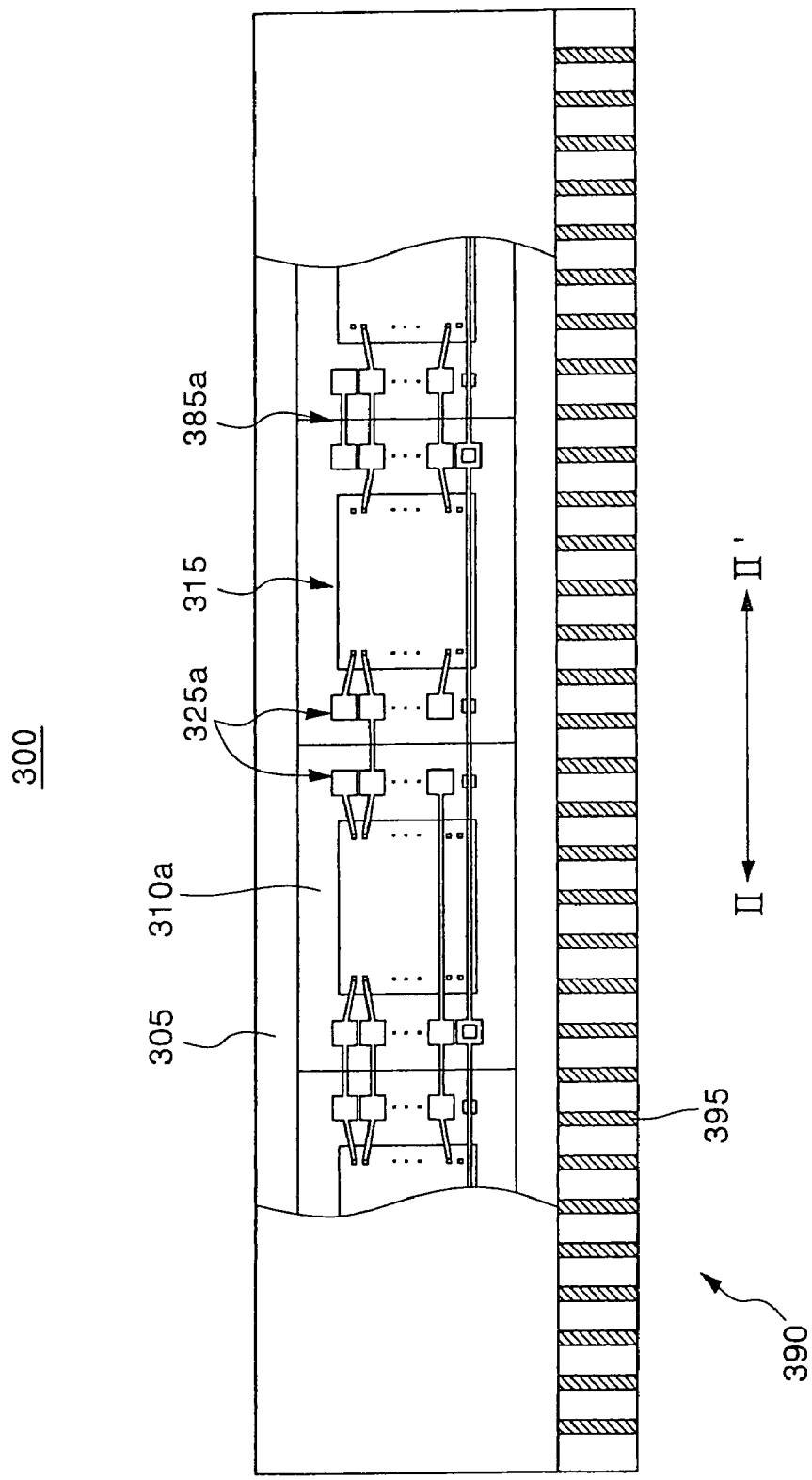

SEMICONDUCTOR PACKAGES AND METHODS OF FABRICATING THE SAME

PRIORITY STATEMENT

This application claims priority under 35 U.S.C. §119 to Korean Patent Application No. 10-2008-0026413, filed Mar. 21, 2008, in the Korean Intellectual Property Office, the entire contents of which are herein incorporated by reference.

BACKGROUND

1. Field

Exemplary embodiments in the inventive concept relate to semiconductor packages and methods of fabricating the same.

2. Description of Related Art

In the field of semiconductor package technologies, chip scale package (CSP) techniques have been under research as package techniques capable of producing packages compact in size and exhibiting high performance. A great deal of research aimed at accomplishing and improving the CSP is being carried out and one such technique involves stacking semiconductor chips. The CSP technique includes stacking wafer level semiconductor chips to fabricate a semiconductor package, so that the integration density of a semiconductor package can be increased.

SUMMARY

Exemplary embodiments provide a semiconductor package, in which two semiconductor chips are electrically connected to each other.

Exemplary embodiments also provide a semiconductor module, in which a plurality of semiconductor chips are electrically connected to each other.

Exemplary embodiments also provide a method of fabricating a semiconductor package, in which two semiconductor chips are electrically connected to each other.

Exemplary embodiments also provide a method of fabricating a semiconductor module, in which a plurality of semiconductor chips are electrically connected to each other.

In accordance with an example embodiment, a method of fabricating a semiconductor package may include bonding rear surfaces of first and second semiconductor chips to each other, each of the semiconductor chips having chip pads exposed on front surfaces. The example method may also include forming an encapsulation portion configured to encapsulate side surfaces of the bonded semiconductor chips, forming via plugs configured to pass through the encapsulation portion, forming an insulating layer configured to expose surfaces of the chip pads and the via plugs on the exposed surfaces of the two semiconductor chips and surfaces of the encapsulation portion, and forming package pads on the exposed surfaces of the chip pads and the surfaces of the via plugs.

In accordance with another example embodiment, a method of fabricating a semiconductor package may include bonding rear surfaces of a plurality of semiconductor chips to each other to form multiple pairs of two semiconductor chips, the semiconductor chips having a plurality of chip pads exposed on front surfaces. The method may include forming an encapsulation portion configured to encapsulate side surfaces of the plurality of bonded semiconductor chips and configured to connect the chip pairs. The method may further include forming via plugs through the encapsulation portion, forming an insulating layer configured to expose surfaces of the chip pads and the via plugs, forming package pads electrically connected to the exposed via plugs on the insulating layer, and forming routing interconnections configured to electrically connect one of the chip pads to one of the package pads. The method may also include forming a redistribution structure on the insulating layer and the routing interconnections, forming a passivation layer on the redistribution structure, and forming an external input/output terminal on the passivation layer.

BRIEF DESCRIPTION OF THE DRAWINGS

Exemplary embodiments are described in further detail below with reference to the accompanying drawings. It should be understood that various aspects of the drawings may have been exaggerated for clarity:

FIGS. 4A and 4B are a plan view and a cross-sectional view schematically illustrating a semiconductor module according to an exemplary embodiment.

DETAILED DESCRIPTION OF THE EMBODIMENTS

Figure 1:
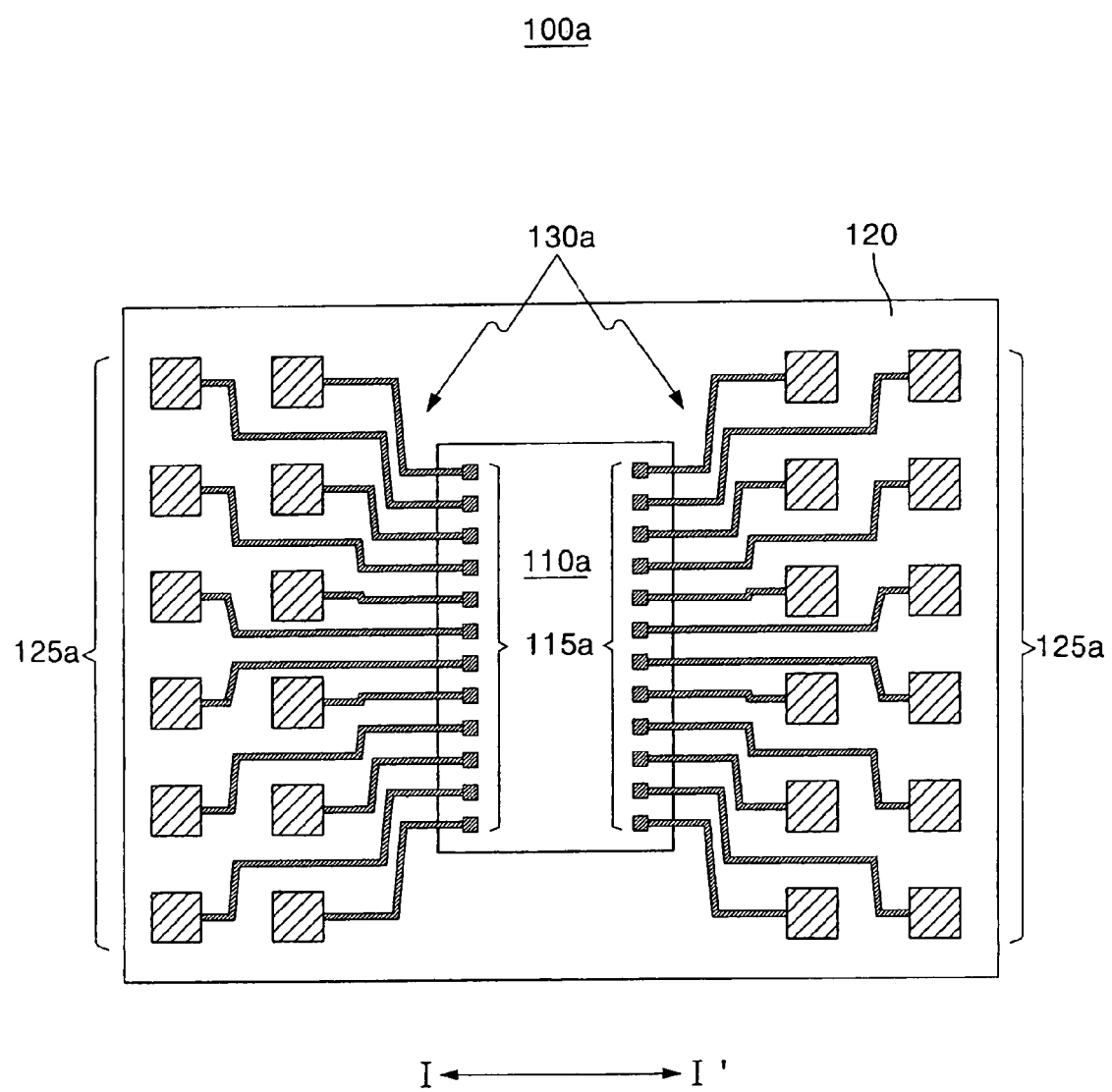
FIG. 1 is a plan view schematically illustrating a semiconductor package according to an exemplary embodiment.

Various exemplary embodiments will now be described more fully with reference to the accompanying drawings in which some exemplary embodiments are shown. In the drawings, the thicknesses of layers and regions may be exaggerated for clarity.

Detailed illustrative embodiments are disclosed herein. However, specific structural and functional details disclosed herein are merely representative for purposes of describing exemplary embodiments. This invention, however, may be embodied in many alternate forms and should not be construed as limited to only exemplary embodiments set forth herein.

Accordingly, while exemplary embodiments are capable of various modifications and alternative forms, embodiments thereof are shown by way of exemplary in the drawings and will herein be described in detail. It should be understood, however, that there is no intent to limit exemplary embodiments to the particular forms disclosed, but on the contrary, exemplary embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of exemplary embodiments. As used herein, the term "and/or" includes any and all combinations of one or more of the associated listed items.

It will be understood that when an element is referred to as being "connected" or "coupled" to another element, it can be directly connected or coupled to the other element or intervening elements that may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Exemplary embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, exemplary embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe exemplary embodiments, various aspects will be described in detail with reference to the attached drawings. However, the present invention is not limited to exemplary embodiments described.

Various terms in semiconductor technologies will be used in the specification. If meanings of the terms are not specially defined or described, the meanings are understood as general meanings in semiconductor technologies. For example, a "via" may mean a vertical line-shaped conductive structure, a "pad" may mean a horizontally enlarged contact area structure to be easier to connect with other structures such as a via, and an "interconnection" may mean a horizontal line-shaped conductive structure.

FIG. 1 schematically illustrates a plan view of a semiconductor package according to an exemplary embodiment. Referring to FIG. 1, a semiconductor package 100a according to an exemplary embodiment may include a semiconductor chip 110a including chip pads 115a, an encapsulation portion 120 encapsulating the semiconductor chip 110a, package pads 125a formed on the encapsulation portion 120, and routing interconnections 130a electrically connecting the chip pads 115a to the package pads 125a. In the drawings, the size and layout of each element is illustrated to easily understand technical features of the inventive concept. The shape, size or layout of each element in the actual semiconductor package may be different from those shown in the drawings.

The semiconductor chip 110a may be referred to as a die which may be at a wafer level. A passivation process or a sawing process may be performed, so that a wafer may be separated into individual chips. Hereinafter, it will be referred to as a semiconductor chip.

The chip pads 115a may be conductive elements that are exposed on the semiconductor chip 110a. Specifically, the chip pads 115a may be elements for inputting or outputting an electrical signal from a chip set into the semiconductor chip 110a or from the semiconductor chip 110a into the chip set. The chip pads 115a may be constituted in various numbers and shapes depending on the type and characteristics of a semiconductor device. For example, the semiconductor chip 110a illustrated in FIG. 1 may include twenty four (24) chip pads 115a. Twelve (12) of the twenty four (24) chip pads 115a may be formed in a line on a left side of the semiconductor chip 110a and the other twelve (12) of the twenty four (24) chip pads 115a may be formed in another line on the right side of the semiconductor chip 110a. However, chip pads of various numbers may be disposed on the semiconductor chip 110a and the chip pads may be formed in various shapes and patterns in the actual semiconductor device. For example, a line of chip pads may be provided near a top 111a side of the semiconductor chip 110a and/or the bottom side 112a of the semiconductor chip 110b in addition to the line of chip pads 115a illustrated at the left and right side of the semiconductor chip 110a.

The chip pads 115a are illustrated to easily understand technical features of the inventive concept. In the actual semiconductor package, other conductive pads (123a in FIG. 2A) may be formed on the chip pads 115a. In this case, the chip pads 115a may not be seen in the plan view.

The encapsulation portion 120 denotes a material encapsulating the semiconductor chip 110a in a wafer state. The encapsulation portion 120 may be formed of a molding material such as an epoxy resin. The completed semiconductor chip 110a in a wafer state may be very compact in size. The chip pads 115a for inputting and outputting an electrical signal may have very narrow intervals in addition to the small size. In order for a semiconductor chip to be applied to a module or a system board, pads may be arranged to comply with the Joint Electron Device Engineering Council (JEDEC) standards. The size of the completed semiconductor chip 110a and the size and layout of the chip pads 115a may vary depending on the technique employed by a manufacturing company. However, since the common JEDEC standards may be applied to the module and the system board, the elements for inputting and outputting an electrical signal may be fabricated to meet the JEDEC standards. In this example embodiment, the semiconductor chip 110a and the chip pads 115a, which may be fabricated in various manners, may be connected to comply with the JEDEC standards by the package pads 125a. The package pads 125a may have the size and arrangement satisfying the JEDEC standards, and at this point, the semiconductor chip package technique may be applied.

Figure 2A:
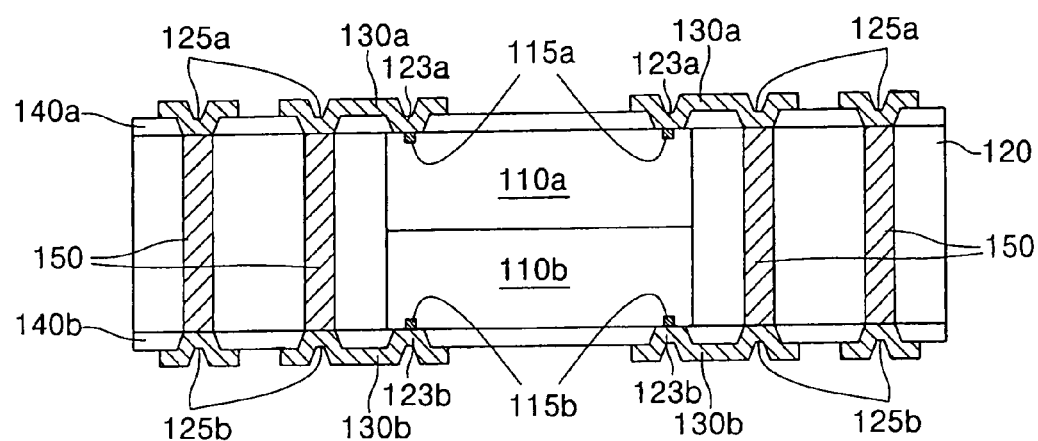
FIGS. 2A and 2B are cross-sectional views schematically illustrating semiconductor packages according to an exemplary embodiment.

The package pads 125a may be arranged on a surface of the encapsulation portion 120 corresponding to a surface of the semiconductor chip 110a as shown in FIGS. 1 and 2A. For example, as shown in FIG. 1, twenty four (24) package pads 125a may be provided on a surface of the encapsulation portion 120. The twenty four (24) package pads may be arranged in four lines such that each line includes six (6) package pads 125a. Two (2) of the four (4) lines of package pads 125a may be positioned on one side of the semiconductor chip 110a and the other two (2) remaining lines of package pads 125a may be positioned on the other side of the semiconductor chip 110a. However, example embodiments are not limited thereto. For example, package pads may be provided, on a surface of the encapsulation portion 120, in a rectangular pattern around the perimeter of the semiconductor chip 110a.

The package pads 125a may be electrically connected to the chip pads 115a by the routing interconnections 130a. As described above, the package pads 125a may be formed to have a structure and arrangement to be electrically connected to an external module or system board. The structure and arrangement to be electrically connected to the external module or system board refer to the structure and arrangement, on which a bump such as a solder ball, etc., may be formed, and may be formed in the position arrangement and shape satisfying the semiconductor standards. For example, this technique may include a chip scale package (CSP) technique, a ball grid array (BGA) technique, and/or a flip chip technique. Therefore, the package pads 125a may be referred to by different names such as under bumped metal (Under Bumped Metal), ball grid, or pin pad depending on the technical field.

As described above, the routing interconnections 130a may electrically connect the chip pads 115a to the package pads 125a. The package pads 125a may be formed after the encapsulation portion 120 is completed and insulating layers (140a and 140b of FIG. 2A) are formed on the top and bottom surfaces of the encapsulation portion 120. The routing interconnections 130a may be formed of a metal, or may be connected to each other by a wire bonding technique or an electro/electroless plating technique. The routing interconnections 130a may be formed using a sputtering, polishing or etching technique as well.

In the exemplary embodiment, on the rear surface that is not shown in FIG. 1, another semiconductor chip (110b of FIG. 2A) whose rear surface faces the rear surface of the semiconductor chip 110a may be formed. At least one of connection portions of the semiconductor chip 110b may pass through the encapsulation portion 120 to be electrically connected to one of the package pads 125a. The technical features of the inventive concept will be described in more detail with reference to FIG. 2A.

FIG. 2A is a cross-sectional view schematically illustrating a semiconductor package according to an exemplary embodiment. More specifically, FIG. 2A is a cross-sectional view taken along line IIA-IIA of FIG. 1. Referring to FIG. 2A, a semiconductor package 100a, according to an exemplary embodiment, may include semiconductor chips 110a and 110b having facing rear surfaces 117a and 117b bonded to each other by an adhesive. The semiconductor chips 110a and 110b may also include chip pads 115a and 115b on front surfaces 116a and 116b that face away from each other. The package may also include chip pad contacts 123a and 123b formed on the chip pads 115a and 115b, an encapsulation portion 120 surrounding the semiconductor chips 110a and 110b, package pads 125a and 125b formed on and under the encapsulation portion 120, vias 150 in and through the encapsulation portion 120 to electrically connect the package pads 125a and 125b to one another, routing interconnections 130a and 130b on and under the encapsulation portion 120 to electrically connect the chip pad contacts 123a and 123b to the package pads 125a and 125b, and insulating layers 140a and 140b formed on each of the semiconductor chips 110a and 110b and the encapsulation portion 120.

In FIGS. 1 and 2A, it is illustrated and described that the routing interconnections 130a and 130b are electrically connected to one of the chip pads 115a and 115b and one of the package pads 125a and 125b. However, this is to enable the technical feature of the inventive concept to be easily understood. That is, the actual semiconductor package may have numerous applications in its shape, and one of the chip pads 115a and 115b may not be connected to one of the package pads 125a and 125b, and the package pads 125a and 125b may be electrically connected to each other. This is because a plurality of chip pads 115a and 115b may have the same function. For example, power supply voltage input and output pads (Vdd I/O pads) or ground voltage input and output pads (Vss I/O pads) are generally formed in plural. Therefore, the package pads 125a and 125b having the same function may be electrically connected to each other at an arbitrary position.

The rear surfaces 117a and 117b of the semiconductor chips 110a and 110b may be bonded to each other by an adhesive. For example, two semiconductor chips 110a and 110b may be electrically connected to each other to form one semiconductor package 100a. The semiconductor chips 110a and 110b are in the state of a wafer, and an adhesive for bonding the wafers is well-known.

The chip pad contacts 123a and 123b are omitted from FIG. 1 to facilitate comprehension of the technical features of the inventive concept. The chip pad contacts 123a and 123b may be formed to enlarge a contact area when the chip pads 115a are electrically connected to the routing interconnections 130a. Also, the chip pad contacts 123a and 123b and the package pads 125a and 125b may be simultaneously formed.

The insulating layers 140a and 140b may be formed on the entire upper and lower surfaces of the semiconductor chips 110a and 110b and the encapsulation portion 120. The insulating layers 140a and 140b may be formed of a kind of passivation material layer, e.g., benzocyclobutene (BCB), polybenzoxazole, polyimide, epoxy, or silicon oxide or silicon nitride. These materials are well-known. In the exemplary embodiment, it is assumed that the layers are formed of photo sensitive polyimide, however, the invention is not limited to only this material. The insulating layers 140a and 140b may expose surfaces of the chip pads 115a and 115b and the vias 150. Detailed descriptions thereof will be provided below. The insulating layers 140a and 140b are omitted from FIG. 1 so that the technical feature of the inventive concept may be easily understood.

The vias 150 may be formed to vertically pass through the encapsulation portion 120, and may electrically connect the package pads 125a and 125b disposed on the top and bottom sides of the encapsulation portion 120 to each other. The vias 150 are conceptually illustrated, and may be formed in different shapes from the drawing in the actual semiconductor package. The vias 150 may be formed of a conductive material, e.g., aluminum (Al), copper (Cu), etc.

Figure 2B:
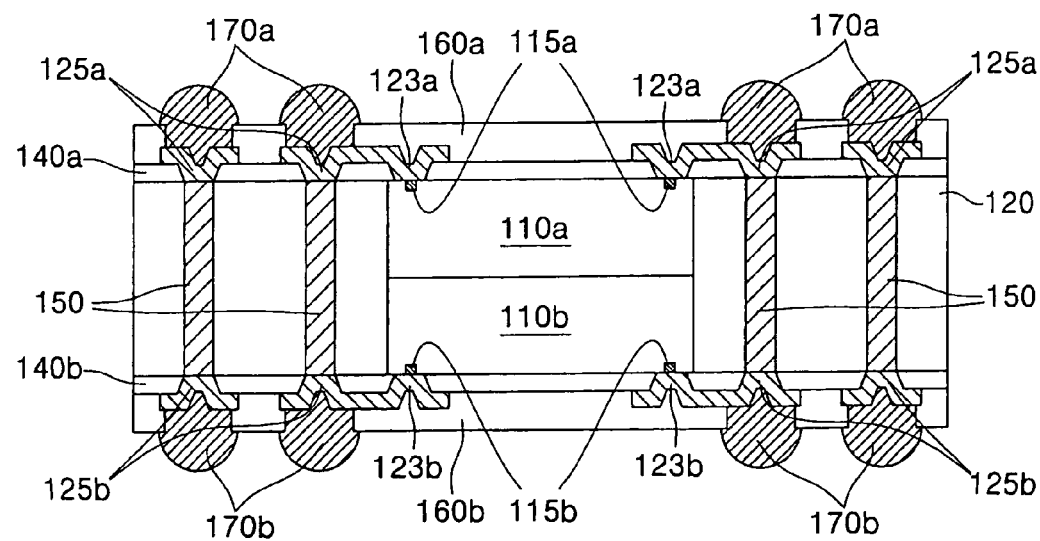

FIG. 2B schematically illustrates a semiconductor package according to another exemplary embodiment. Referring to FIG. 2B, a semiconductor package 100b according to another exemplary embodiment may include insulating layers 160a and 160b formed on the upper and lower surfaces of the semiconductor package 100a illustrated and described in FIG. 2A, and solder balls 170a and 170b may be formed on the package pads 125a and 125b. Since the solder balls 170a and 170b are well-known, detailed descriptions thereof will be omitted.

In the exemplary embodiment, the solder balls 170a and 170b may be formed to fill holes formed in the insulating layers 160a and 160b. According to the exemplary embodiment, between the package pads 125a and 125b and the solder balls 170a and 170b, adhesive strength may be excellent, contact resistance may be low, and structural durability may be excellent. That is, solder-ball joint reliability may be improved.

Figure 3A:
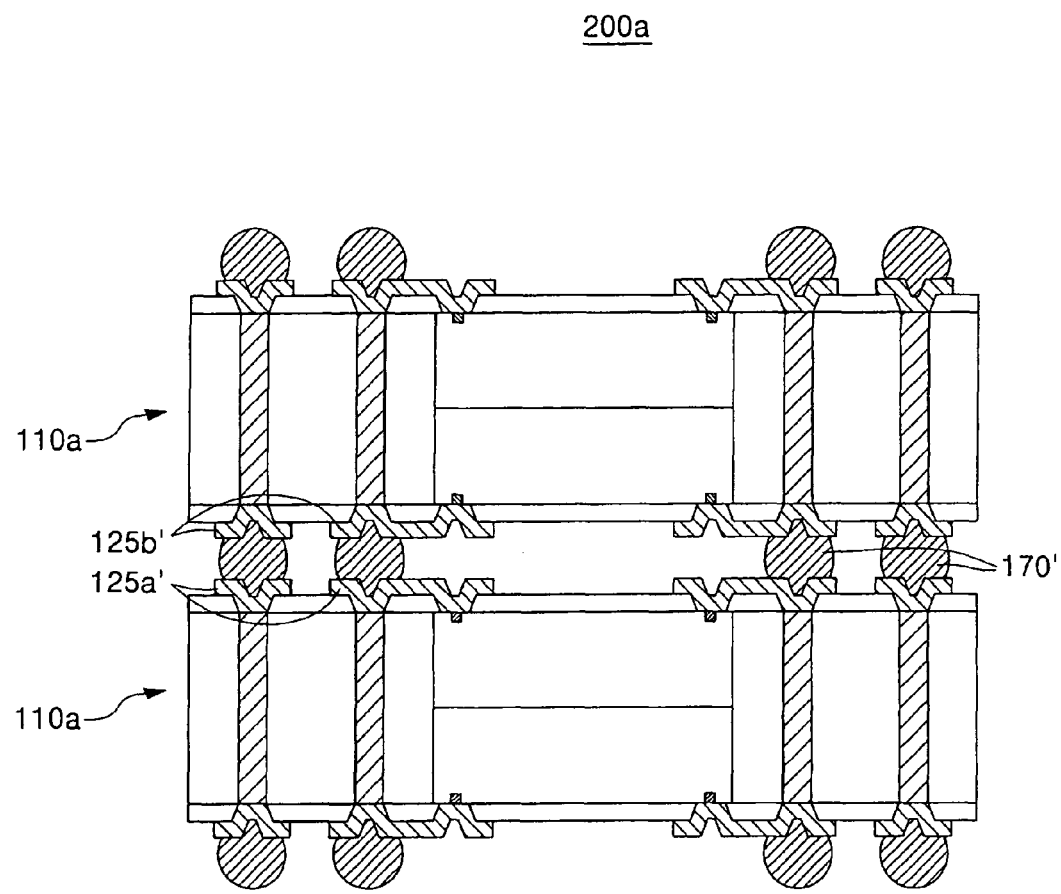
FIGS. 3A and 3B are cross-sectional views schematically illustrating package stack structures according to an exemplary embodiment.
Figure 3B:
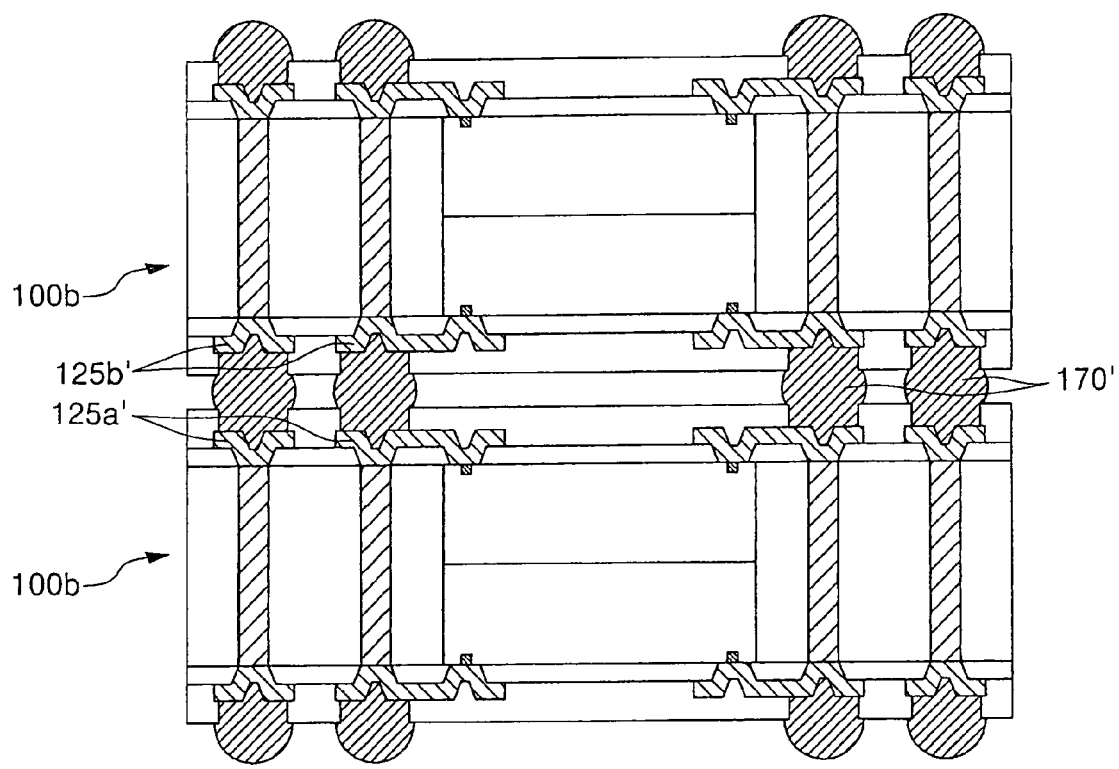

FIGS. 3A and 3B are cross-sectional views schematically illustrating package stack structures according to exemplary embodiments.

Referring to FIG. 3A, a semiconductor package stack structure 200a according to an exemplary embodiment may be formed by stacking the two semiconductor packages 100a illustrated and described in FIG. 2A.

While the semiconductor packages 100a according to an exemplary embodiment are stacked, package pads 125a' and 125b' may be electrically connected to each other by solder balls 170'. According to the exemplary embodiment, a semiconductor package or a semiconductor module structure exhibiting excellent integration density per unit area can be obtained.

Referring to FIG. 3B, a semiconductor package stack structure 200b according to another exemplary embodiment may be formed by stacking the semiconductor packages 100b illustrated and described in FIG. 2B.

A space between the two stacked semiconductor packages 100b may be filled with a molding material or a filler. According to the exemplary embodiment, a semiconductor package or a semiconductor module exhibiting excellent integration density per unit area may be obtained, and the package stack structure 200b exhibiting excellent electrical and physical characteristics may be obtained.

Each of the package stack structure 200a and 200b according to the exemplary embodiments are merely examples of the invention. More semiconductor packages 100a and 100b may be stacked to form each package stack structure 200a and 200b. For example, in a case of one semiconductor memory module, since eight (8) semiconductor devices are integrated to form the semiconductor memory module, eight (8) semiconductor chips or four (4) semiconductor packages according to the exemplary embodiments may constitute one semiconductor memory module.

Figure 4B:
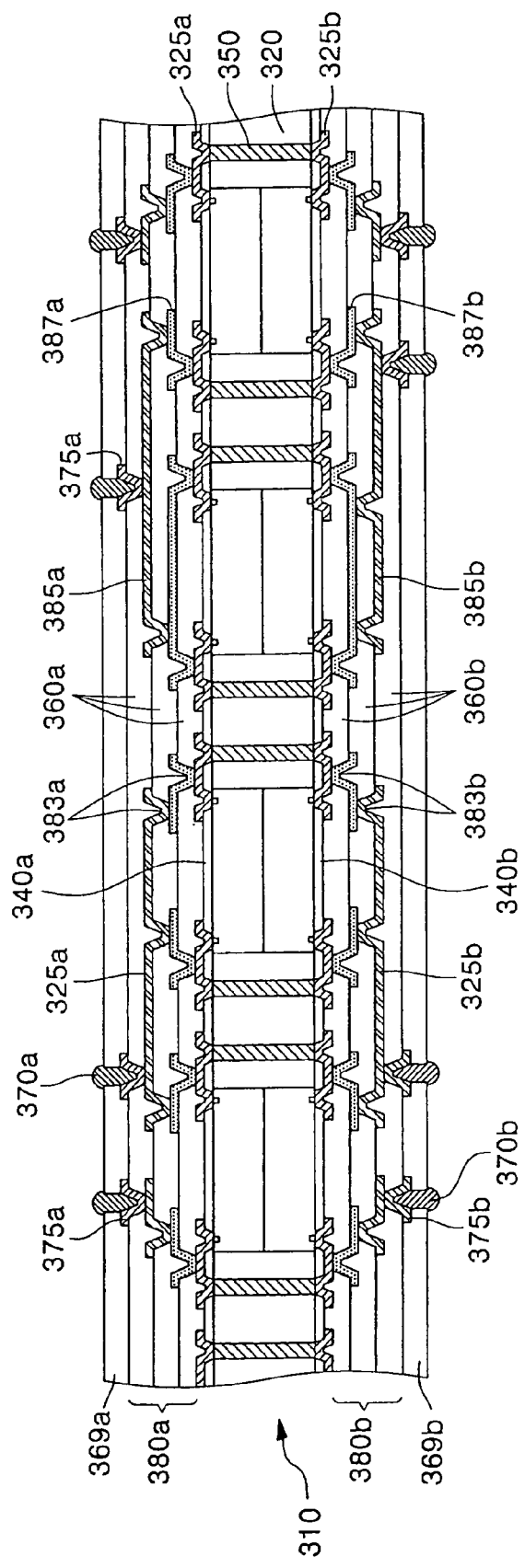

FIGS. 4A and 4B schematically illustrate a semiconductor module, to which a wafer level package redistribution technique is applied, according to an exemplary embodiment. Since the drawings are conceptually illustrated, in the actual semiconductor module, the redistribution structure may be formed in different shapes from that illustrated in the drawings.

Referring to FIG. 4A, a semiconductor module 300 according to an exemplary embodiment may include a plurality of semiconductor packages 310a, and interconnections 385a electrically connecting package pads 325a of each of the semiconductor packages 310a. In the drawing, a semiconductor memory module is exemplified. Generally, a semiconductor memory module may include eight (8) semiconductor memory devices. Therefore, in the drawing, it is illustrated that four (4) semiconductor packages 310a according to the exemplary embodiment are included in a semiconductor memory module. As shown in FIG. 4A, the semiconductor packages 310a may be aligned in a row along the length of the semiconductor module 300 with package pads 325 and interconnections 385a formed therebetween. To enable the technical features of the inventive concept to be easily understood, the semiconductor module 300 is illustrated as partially decapsulated. Further, the exemplary embodiment is shown with a redistribution structure formed of a single layer, and chip pads and package pads 325a formed in a line.

Referring again to FIG. 4A, some of the package pads 325a of each of the semiconductor packages 310a may be electrically connected to each other through interconnections 385a for redistribution. The interconnections 385a for redistribution may be formed to enable the technical features of the inventive concept to be concisely and conceptually described. The interconnections 385a for redistribution may be formed in various shapes in the actual semiconductor module. The interconnections 385a for redistribution may be formed in a multilayer structure, and may include a via or a pad structure. Further, interconnections 385a may electrically connect three or more package pads 325a to each other in a horizontal direction, in a vertical direction or in a diagonal direction. Detailed description thereof will be provided below.

The completed semiconductor module 300 may include a socket contact portion 390 and contact taps 395. A plurality of contact taps 395 may be formed on the socket contact portion 390, and the contact taps 395 may be inserted into a module socket on a system board.

FIG. 4B is a cross-sectional view taken along line IVB-IVB of FIG. 4A. Referring to FIG. 4B, a semiconductor module 300 according to an exemplary embodiment may include semiconductor packages 310 and redistribution structures 380a and 380b electrically connecting the semiconductor packages 310 to each other.

The redistribution structures 380a and 380b may include an upper redistribution structure 380a and a lower redistribution structure 380b. The upper redistribution structure 380a and the lower redistribution structure 380b may have a mirroring structure, i.e., may be symmetrical in a vertical direction. Therefore, in the specification, one particular redistribution structure, specifically, only the upper redistribution structure 380a will be illustrated and described without illustrating and describing the lower redistribution structure 380b.

Module pads 375a may be formed on the upper redistribution structure 380a, and solder balls 370a may be formed on the module pads 375a. Since the semiconductor package 310a was previously described, further descriptions will be omitted.

The redistribution structure 380a may include insulating layers 360a for redistribution, vias 383a for redistribution, interconnections 385a for redistribution, and pads 387a for redistribution. The redistribution structure 380a may be formed on the insulation layer 340a, the vias 350, and the encapsulation portion 320, and the semiconductor packages 310.

The insulating layers 360a for redistribution may be formed in a multilayer structure depending on the redistribution structure 380a. In the drawing, it is illustrated on the assumption that three layers are formed. The insulating layers 360a for redistribution may be formed of a passivation material, e.g., polyimide. However, this material is simply exemplified, and one or more insulating materials widely used in the semiconductor technique field such as benzocyclobutene (BCB), polybenzoxazole, polyimide, epoxy, or silicon oxide or silicon nitride may be selected to form the insulating layers for redistribution. That an insulating layer may be formed by selecting one or more materials means that the insulating layer illustrated as a single layer in the drawing may be formed of two or more layers. In the exemplary embodiment, it is assumed that the insulating layers 360a for redistribution are formed of polyimide, in particular, photo sensitive polyimide of a single layer.

The vias 383a for redistribution may be structures that electrically connect the package pads 325a of the semiconductor package 310a to an external terminal such as a solder ball 370a in a vertical direction. In the drawing, the vias 383a for redistribution are horizontal interconnection structures with a curve, or a part of the pads. However, in the actual semiconductor module, the vias 383a for redistribution may be formed in a column shape in a vertical direction and may be formed to have a smaller curve than that shown in the drawing. In addition, the vias 383a for redistribution may be integrally formed with the interconnections 385a for redistribution or the pads 387a for redistribution. In other words, the vias 383a for redistribution and the interconnections 385a for redistribution may be simultaneously formed.

The interconnections 385a for redistribution may be structures for connecting one or more of the package pads 325a of the semiconductor package 310a to an external terminal, and in particular, for electrically connecting two or more package pads 325a. While FIGS. 4A and 4B illustrate the interconnections 385a for redistribution as being formed in parallel, they may be formed in various and complex shapes in the actual package. This is because the interconnections 385a for redistribution may be formed in a multilayer structure, and as described above, one semiconductor chip may include a plurality of input/output nodes having the same function. While the input/output nodes having the same function, i.e., the package pads 325a may be connected to separate external terminals, the plurality of nodes may be connected to one external terminal in parallel.

The pads 387a for redistribution may be formed as illustrated in the drawing, and may be formed in more various shapes. For example, the pads 387a for redistribution may be the vias 383a for redistribution, or a part of the interconnections 385a for redistribution. That the pads 387a for redistribution may be the vias 383a for redistribution means that the pads 387a may have functions of both elements. In the exemplary embodiment, for clarity it is illustrated and described that the pads 387a for redistribution are formed to extend onto the insulating layers 360a for redistribution.

An insulating passivation layer and structures for being electrically connected to an external terminal may be formed on the redistribution structure 380a. In the exemplary embodiment, it is illustrated that a passivation layer 369a, module pads 375a and a solder ball 370a are formed.

The passivation layer 369a may include an insulating material and may protect the semiconductor module 300 from external electric and physical impact. In the exemplary embodiment, polyimide may be used. A method of forming the passivation layer 369a using polyimide is well-known.

The module pads 375a may be formed of a conductive material and may include an under bumped metal (UBM), a ball grid or a pin pad. They may be formed in a single layer or multilayer structure including aluminum, copper, titanium, or a compound thereof, or an alloy thereof. While it is illustrated that they are formed of a single material layer, they may be formed in a multilayer structure including various materials.

A hole vertically passing through the passivation layer 369a, and exposing the surfaces of the module pads 375a may be formed, and the solder ball 370a filling the hole may be formed.

In the exemplary embodiment, the solder balls 370a may not be necessarily formed to implement the technical features of the inventive concept. For example, a structure that may be connected using a bonding wire, or may be in contact with pins may be implemented. In this case, the exposed part of the module pads 375a may be formed to extend onto the passivation layer 369a. All such applications are included in the technical features of the inventive concept.

The conductive structure formed on the passivation layer 369a may function as an external input/output terminal. In the exemplary embodiment, the structure may be the solder ball 370a, in particular, the exposed solder ball 370a.

As previously stated, the semiconductor module 300 may be formed such that the redistribution structure 380b may be formed to be symmetrical to redistributing structure 380a. For example, the lower redistributing structure 380b may be formed on the insulation layer 340b, which is under the semiconductor packages 310, the vias 350, and the encapsulation portion 320. Further, the lower redistributing structure 380b may include module pads 375b, solder balls 370b, package pads 325b, vias 383b, insulating layers 360b, interconnections 385b, and pads for redistribution 387b corresponding to the module pads 375a, solder balls 370a, package pads 325a, vias 383a, insulating layers 360a, interconnections 385a, and pads for redistribution 387a. A passivation layer 369b may also be provided on the lower redistribution structure 380b corresponding to the passivation layer 369a provided on the upper redistribution structure 380a.

The semiconductor packages and the semiconductor module according to the exemplary embodiment may be formed to have a structure in which two semiconductor chips whose rear surfaces are bonded to each other are electrically connected to each other.

FIGS. 5A to 5H are cross-sectional views schematically illustrating a method of fabricating a semiconductor package or a semiconductor module according to exemplary embodiments.

Figure 5A:
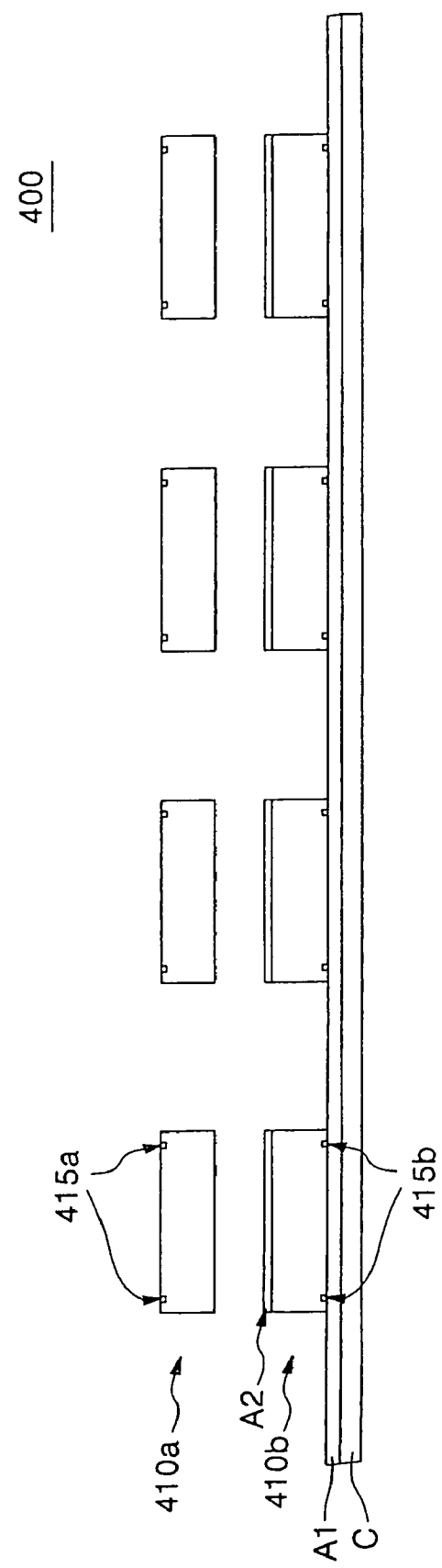
FIGS. 5A to 5H are cross-sectional views schematically illustrating a method of fabricating a semiconductor package or a semiconductor module according to an exemplary embodiment.

Referring to FIG. 5A, a carrier adhesive A1 may be applied on a carrier panel C, and a lower semiconductor chip 410b may be bonded thereon.

The carrier panel C may be in the shape of a wafer or a rectangle, and may be made of metal, glass, silicon, etc. Also, it may be formed of a hard flat panel. Since the carrier panel C is well-known in semiconductor packaging technology, further descriptions will be omitted.

The carrier adhesive A1 may be used to bond the lower semiconductor chip 410b onto the carrier panel C. The carrier adhesive A1 may be applied on the carrier panel C by a laminating method, a coating method, a pasting method, or a printing method. The carrier adhesive A1 may be made of a thermoplastic adhesive or resin. That is, even though the material is hardened, when a heat higher than a glass transition temperature is applied, its viscosity may be recovered, so that the bonded materials may be easily separated. The glass transition temperature has been known to vary depending on each adhesive. Since methods of applying the adhesive A1 on the carrier panel C are well-known, further descriptions thereof will be omitted.

The lower semiconductor chip 410b may be bonded such that an active surface of the lower semiconductor chip 410b faces the carrier panel C. The active surface refers to a surface where chip pads 415b are formed. An upper semiconductor chip 410a may be bonded onto the lower semiconductor chip 410b with a chip adhesive A2. Specifically, the chip adhesive A2 may be applied on an upper surface of the lower semiconductor chip 410b bonded onto the carrier panel C, i.e., on the rear surface 417b, and the rear surface 417a of the upper semiconductor chip 410a may be bonded thereon. As shown in FIG. 5A, the active surface of the upper semiconductor chip 410a, that is, the surface including the chip pads 415a, faces away from the lower semiconductor chip 410b and the active surface of the lower semiconductor chip 410b including the chip pads 415b faces away from the upper semiconductor chip 410a. The chip adhesive A2 may not be a thermoplastic adhesive, and is well-known. In the following drawings, the chip adhesive A2 may be omitted.

In the exemplary embodiment, each of the semiconductor chips 410a and 410b may be individual chips (or dies) separated from a wafer.

Figure 5B:
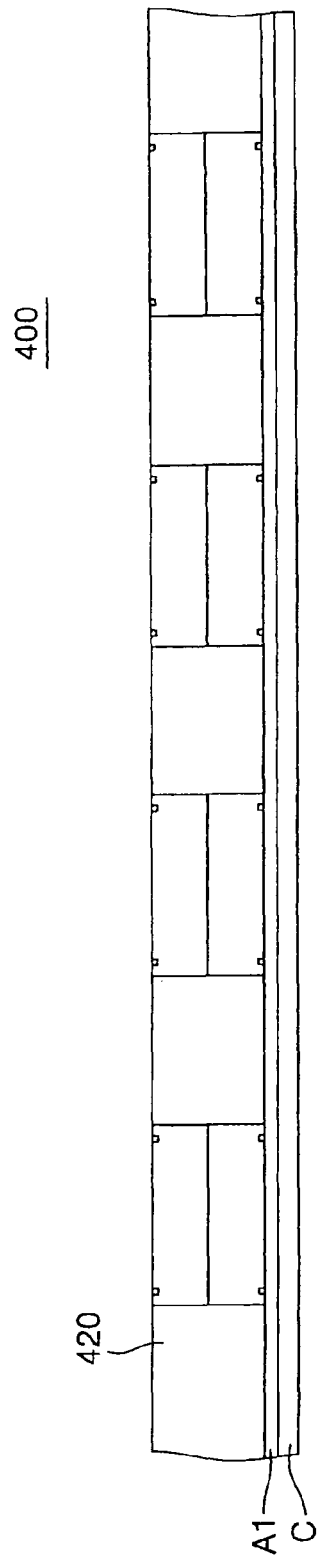

Referring to FIG. 5B, an encapsulation portion 420 encapsulating a space between and or to the sides of each of the semiconductor chips 410a and 410b may be formed.

The encapsulation portion 420 may be formed of an insulating material such as an epoxy resin or polyimide. The encapsulation portion 420 may be formed by a distribution method or after bonding the semiconductor chips 410a and 410b onto the carrier panel C, the bonded results may be immersed upside down in an encapsulation material that is in a gel state. In the final step of forming the encapsulation portion 420, the surface of the semiconductor chip 410a may be adjusted to be as high as that of the encapsulation portion 420. A method of adjusting the two surfaces to be similar to each other may include a polishing method. However, a coating or screen printing method may be used, and the two surfaces may not be necessarily formed to the same height.

After the encapsulation portion 420 is formed between and/or to the sides of the semiconductor chips 410a and 410b, the adhesive A1 and the carrier plate C are removed. As previously discussed, the adhesive A1 may be made of a thermoplastic adhesive or resin. Accordingly, after the encapsulation portion 420 is formed, the adhesive A1 may be heated to raise the temperature of the adhesive A1 above the adhesive's glass transition temperature to render the adhesive A1 viscous. When the adhesive A1 is in the viscous state, the carrier plate C may be removed from the semiconductor chips 410a and 410b and the encapsulation portion 420. The semiconductor chips 410a and 410b, the encapsulation portion 420, and the carrier panel C with the adhesive A1 may, for example, be heated in an oven or placed on a "hot" plate to raise the temperature of the adhesive A1 above its glass transition temperature.

Figure 5C:
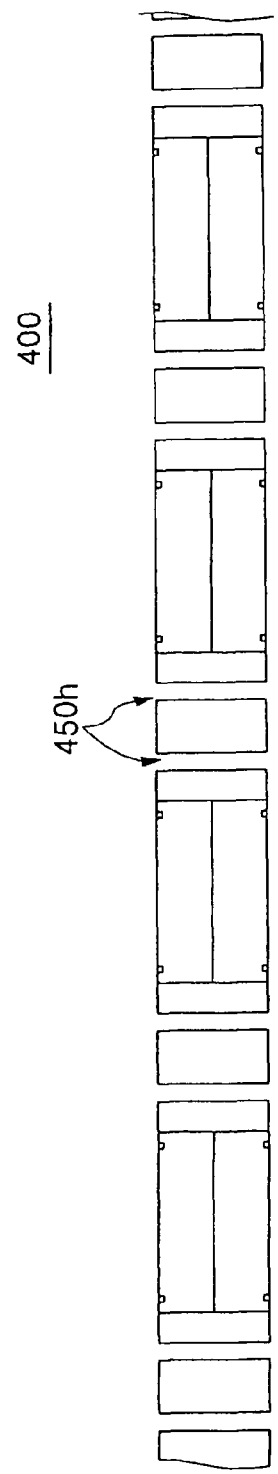

Referring to FIG. 5C, via holes 450h vertically passing through the encapsulation portion 420 may be formed. Methods of forming the via holes 450h are well-known. For example, the via holes 450h may be formed by a laser drilling method, however, the invention is not limited thereto as other well known methods may be used to form the via holes 450h.

Figure 5D:
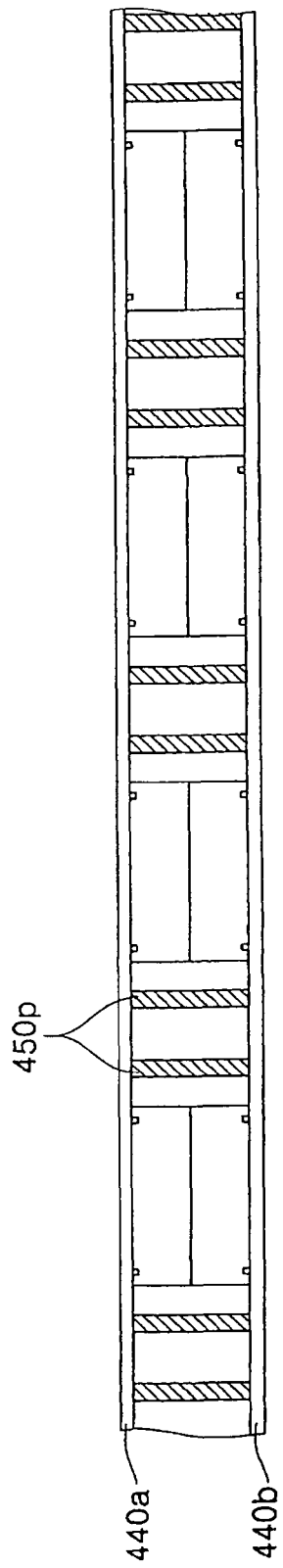

Referring to FIG. 5D, via plugs 450p may be formed, and insulating layers 440a and 440b may be formed.

The via plugs 450p may be formed by filling the via holes 450h with a conductive material such as a metal. The via plugs 450p may be formed by various methods, for example, by an electro/electroless plating method. Forming the via plugs 450p, however, is not limited thereto as there are several well-known methods capable of forming the via plugs 450p.

The insulating layers 440a and 440b may be formed on the surfaces of the semiconductor chips 410a and 410b, the surfaces of the encapsulation portion 420, and the surfaces of the via plugs 450p. The insulating layers 440a and 440b may be formed by a distribution method. In the drawing, among the insulating layers 440a and 440b, an insulating layer formed on the surface of the upper semiconductor chip 410a is referred to as an upper insulating layer 440a, and the other formed on the surface of the lower semiconductor chip 410b is referred to as a lower insulating layer 440b. While the upper and lower insulating layers 440a and 440b may be formed at the same time, they may be sequentially formed. As described above, the insulating layers 440a and 440b may be formed of various materials. For example, the insulating layers 440a and 440b may be formed of photo sensitive polyimide.

After the via plugs 450p and the insulating layers 440a and 440b are formed, a planarization process may be performed. The planarization process may include a blanket etch process or a polishing process.

Figure 5E:
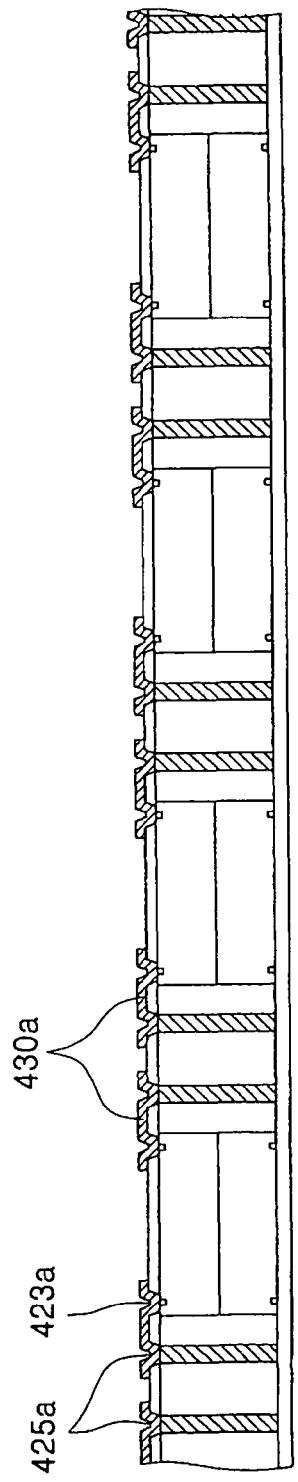

Referring to FIG. 5E, the upper insulating layer 440a may be patterned to expose surfaces of the chip pads 415a and the via plugs 450p. Routing interconnections 430a may be formed after the patterning operation. A method of patterning the insulating layers 440a and 440b may vary depending on the material. For example, the method of patterning may include a mechanical or optical drilling method, a polishing method or a photo/etching method. In the exemplary embodiment, the photo/etching method may be used.

The routing interconnections 430a may be formed by an electro/electroless plating method, a deposition/patterning method, or a screen printing method, and in the exemplary embodiment, it is assumed that they are formed by a screen printing method. Here, the routing interconnections 430a may include a package pad contact portion 425a over a via plug 450 or a chip pad contact portion 423a over a chip pad 415a depending on the location where the routing interconnections 430a are formed or their functions.

Figure 5H:
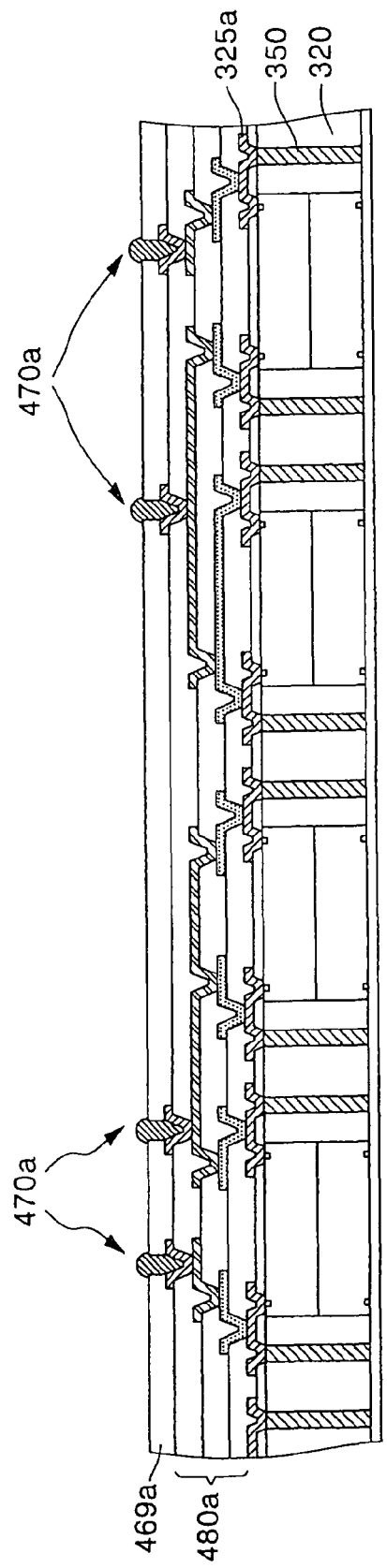
Figure 5F:
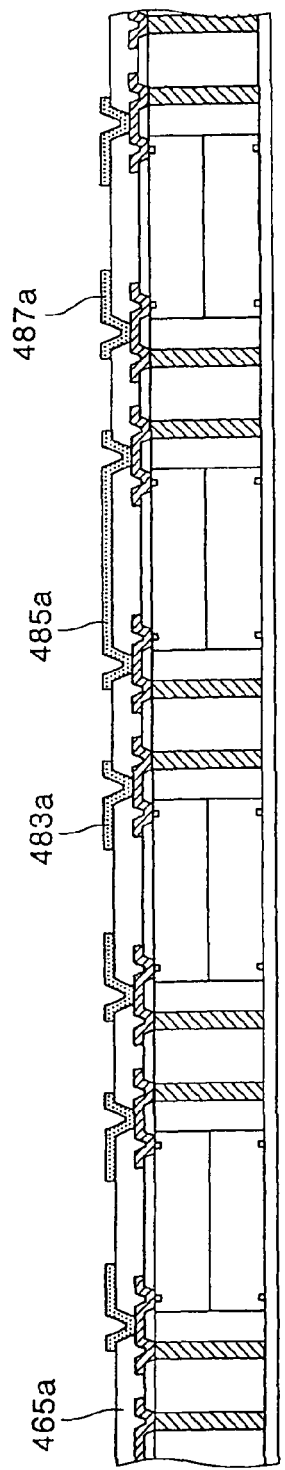

Referring to FIG. 5F, a first insulating layer 465a for redistribution may be formed on the insulating layer 440a to cover the routing interconnections 430a. The first interconnections 485a for redistribution may be formed on the first insulating layer 465a for redistribution.

The first insulating layer 465a for redistribution may be formed of materials used to form the insulating layers 440a and 440b. In the exemplary embodiment, it is assumed that the first insulating layer 465a for redistribution is formed of polyimide. The first insulating layer 465a for redistribution may be patterned to expose parts of the routing interconnections 430a. A method of patterning the first insulating layer 465a for redistribution was previously described.

The first interconnections 485a electrically connected to the exposed parts of the routing interconnections 430a may be formed. The first interconnections 485a for redistribution may be formed of the same material as or similar material to the routing interconnections 430a using equivalent or similar methods. The first interconnections 485a for redistribution may include first vias 483a for redistribution and/or first pads 487a for redistribution.

Figure 5G:
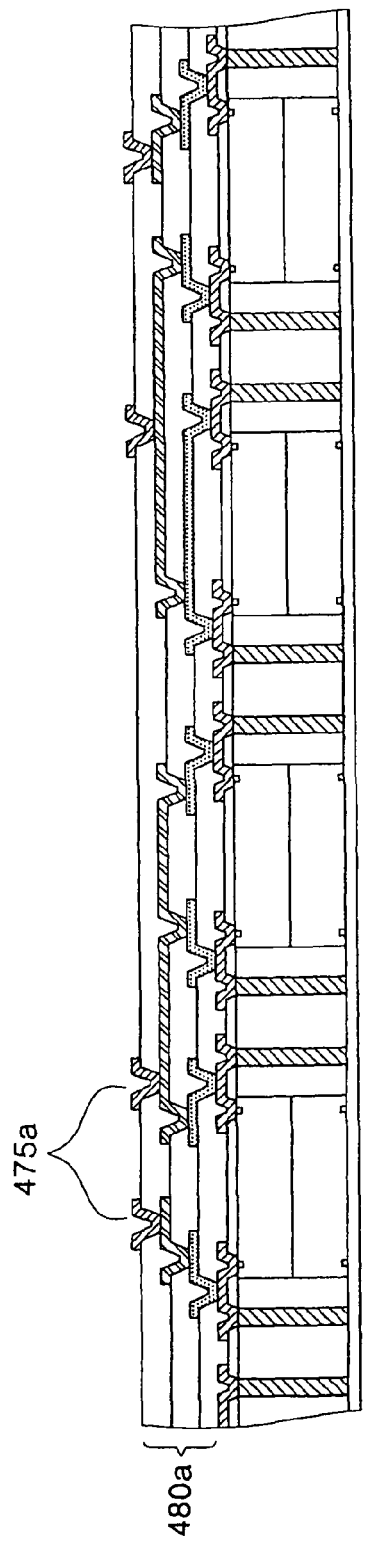

Referring to FIG. 5G, after a redistribution structure 480a may be formed, module pads 475a may be formed on the redistribution structure 480a. Methods of forming the redistribution structure 480a and the module pads 475a would have been sufficiently understood from FIG. 5F and descriptions thereof.

Referring to FIG. 5H, a passivation layer 469a and a solder ball 470a may be formed on the redistribution structure 480a.

The passivation layer 469a may be formed of polyimide in the exemplary embodiment. The passivation layer 469a may be patterned to expose surfaces of the module pads 475a.

The solder ball 470a may be formed on the exposed module pads 475a so that the module pads 475a can be electrically connected to the outside.

As described above, the solder ball 470a may not be necessarily formed. Also, in this case, the exposed part of the module pads 475a may be formed to extend onto the passivation layer 469a.

In FIGS. 5A to 5H, it is illustrated and described that only one redistribution structure 480a is formed. This does not mean that only one redistribution structure 480a is formed, but means that another redistribution structure may be formed by various methods. Specifically, referring to FIG. 4B, the process of forming the upper redistribution structure 480a and the process of forming the lower redistribution structure 480b may be alternately performed or after one of the redistribution structures 480a and 480b is completely formed, the other may be formed.

As described above, according to exemplary embodiments, a semiconductor package and module, and methods of fabricating the same exhibiting more stable, simplified and improved performance may be obtained.

While exemplary embodiments have been disclosed herein, it should be understood that other variations may be possible. Such variations are not to be regarded as a departure from the spirit and scope of exemplary embodiments of the present application, and all such modifications as would be obvious to one skilled in the art are intended to be included within the scope of the following claims.

What is claimed is:

1. A method of fabricating a semiconductor package, comprising:
    bonding rear surfaces of first and second semiconductor chips to each other, each of the semiconductor chips having chip pads exposed on front surfaces;
    forming an encapsulation portion configured to encapsulate side surfaces of the bonded semiconductor chips;
    forming via plugs configured to pass through the encapsulation portion;
    forming an insulating layer configured to expose surfaces of the chip pads and the via plugs on the exposed surfaces of the two semiconductor chips and surfaces of the encapsulation portion; and
    forming package pads on the exposed surfaces of the chip pads and the surfaces of the via plugs.

2. The method of claim 1, wherein bonding the rear surfaces of the two semiconductor chips includes:
    forming a carrier adhesive layer on a carrier panel;
    bonding the front surface of the first semiconductor chip onto the carrier adhesive layer; and
    bonding the rear surface of the first semiconductor chip to the rear surface of the second semiconductor chip.

3. The method of claim 2, wherein forming the encapsulation portion includes immersing the carrier panel, to which the first and second semiconductor chips are bonded, upside down into a gel-state encapsulation material.

4. The method of claim 3, further comprising:
    separating the carrier adhesive layer and the bonded semiconductor chip after forming the encapsulation portion.

5. The method of claim 3, wherein the encapsulation portion includes an epoxy resin.

6. The method of claim 1, wherein forming the via plugs includes forming via holes in the encapsulation portion using a laser drilling method and filling the via holes with a material including a metal.

7. The method of claim 1, further comprising:
    forming a passivation layer on the insulating layer and the package pads; and
    patterning the passivation layer to expose surfaces of the package pads.

8. The method of claim 1, further comprising:
    forming a routing interconnection configured to electrically connect one of the chip pads to one of the package pads on the insulating layer.

9. The method of claim 8, wherein forming the routing interconnection is performed by a screen printing method.

10. The method of claim 8, wherein the package pads are formed on a part of the routing interconnections.

11. The method of claim 1, wherein the semiconductor chips are in the state of a wafer divided into pieces.

12. A method of fabricating a semiconductor package, comprising:
    bonding rear surfaces of a plurality of semiconductor chips to each other to form multiple pairs of two semiconductor chips, the semiconductor chips having a plurality of chip pads exposed on front surfaces;
    forming an encapsulation portion configured to encapsulate side surfaces of the plurality of bonded semiconductor chips and configured to connect the chip pairs;
    forming via plugs through the encapsulation portion;
    forming an insulating layer configured to expose surfaces of the chip pads and the via plugs on the exposed surfaces of the semiconductor chips and surfaces of the encapsulation portion;
    forming package pads electrically connected to the exposed via plugs on the insulating layer;
    forming routing interconnections configured to electrically connect one of the chip pads to one of the package pads;
    forming a redistribution structure on the insulating layer and the routing interconnections;
    forming a passivation layer on the redistribution structure; and
    forming an external input/output terminal on the passivation layer.

13. The method of claim 12, wherein the encapsulation portion is formed of an epoxy resin, and the insulating layer and the passivation layer are formed of one of benzocyclobutene (BCB), polybenzoxazole, polyimide, epoxy resin, silicon oxide and silicon nitride.

14. The method of claim 12, wherein the redistribution structure includes an insulating layer for redistribution, an interconnection for redistribution, and a pad for redistribution.

15. The method of claim 14, wherein the interconnection for redistribution is electrically connected to a part of the routing interconnections.

16. The method of claim 15, wherein the interconnection for redistribution is formed in a multilayer structure, the multilayer structure including a via for redistribution configured to vertically and electrically connect interconnections for redistribution to each other.

17. The method of claim 14, further comprising:
    patterning the passivation layer so that the pad for redistribution is exposed, wherein the operation of patterning the passivation layer occurs after forming the passivation layer.

18. The method of claim 17, wherein the external input/output terminal is formed on the exposed pad for redistribution.

19. The method of claim 17, wherein the patterned passivation layer includes a hole pattern configured to expose the pad for redistribution.

20. The method of claim 12, wherein the semiconductor chips are in the state of a wafer divided into pieces.

* * * * *